US008860159B2

(12) United States Patent
Meitzler et al.

(10) Patent No.: US 8,860,159 B2
(45) Date of Patent: Oct. 14, 2014

(54) SPINTRONIC ELECTRONIC DEVICE AND CIRCUITS

(75) Inventors: Thomas J. Meitzler, Troy, MI (US); Elena N. Bankowski, Royal Oak, MI (US); Michael Nranian, South Lyon, MI (US); Ilya N. Krivorotov, Irvine, CA (US); Andrei N. Slavin, Rochester Hills, MI (US); Vasyl S. Tyberkevych, Rochester Hills, MI (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 263 days.

(21) Appl. No.: 13/278,020

(22) Filed: Oct. 20, 2011

(65) Prior Publication Data

US 2013/0099339 A1    Apr. 25, 2013

(51) Int. Cl.
| | |
|---|---|
| H01L 29/82 | (2006.01) |
| H01L 27/108 | (2006.01) |
| H01L 21/469 | (2006.01) |
| H01F 10/32 | (2006.01) |
| H01L 43/08 | (2006.01) |
| G01R 33/09 | (2006.01) |

(52) U.S. Cl.
CPC .......... *G01R 33/098* (2013.01); *H01F 10/3268* (2013.01); *H01L 43/08* (2013.01); *G01R 33/09* (2013.01); *H01F 10/3254* (2013.01); *H01F 10/329* (2013.01); *Y10S 977/933* (2013.01); *Y10S 977/934* (2013.01); *Y10S 977/935* (2013.01)
USPC .... 257/424; 257/421; 257/295; 257/E29.333; 257/E43.004; 257/E43.001; 360/324; 360/324.11; 360/324.2; 360/324.12; 365/171; 365/148; 977/933; 977/934; 977/935; 438/3; 438/785; 428/212; 428/216

(58) Field of Classification Search
CPC .......... H01L 43/08; H01L 43/10; H01L 43/12; H01L 29/82; H01L 29/66984; H01L 27/20; H01L 27/22; H01L 27/222; H01L 27/224; H01L 27/228

USPC .......... 257/421–427, 295, E21.665, E27.005, 257/E29.323, E43.001–E43.007; 360/324, 360/324.2, 324.11, 324.12, 324.1, 86, 360/97.01, 135, 113; 365/171, 55, 66, 148, 365/158, 173, 80, 83, 85; 977/933–935; 438/3, 48, 785, E21, 998, 692.1, 693.1
See application file for complete search history.

(56) References Cited

U.S. PATENT DOCUMENTS

| | | | |
|---|---|---|---|
| 5,677,625 | A | 10/1997 | Dieny |
| 5,695,864 | A | 12/1997 | Slonczewski |

(Continued)

FOREIGN PATENT DOCUMENTS

EP           002581940 A1 *  6/2011     ............ H01L 43/12

OTHER PUBLICATIONS

Krzysteczko—Memristive switching of MgO based magnetic tunnel junctions—10-07-2009.pdf.*

(Continued)

*Primary Examiner* — Chuong A Luu
*Assistant Examiner* — Moazzam Hossain
(74) *Attorney, Agent, or Firm* — David L. Kuhn; Thomas W. Saur; Luis Miguel Acosta (57) ABSTRACT

A spintronic electronic apparatus having a multilayer structure. The apparatus includes a substrate, having disposed in succession upon the substrate; a bottom interface layer; a pinned layer; a tunneling barrier; a free layer; and a top interface layer, wherein the apparatus operates as a non-resonant magnetic tunnel junction in a large amplitude, out-of-plane magnetization precession regime having weakly current dependent, large diode volt-watt sensitivity when external microwave signals that exceed a predetermined threshold current and have a frequency that is lower than a predetermined level excite the magnetization precession.

3 Claims, 4 Drawing Sheets

(56) References Cited

U.S. PATENT DOCUMENTS

| | | | |
|---|---|---|---|
| 6,430,015 B2 | 8/2002 | Ju et al. | |
| 6,473,279 B2 | 10/2002 | Smith et al. | |
| 6,819,530 B2 | 11/2004 | Gill | |
| 6,894,878 B1 | 5/2005 | Cross | |
| 7,084,605 B2 | 8/2006 | Mickle et al. | |
| 7,138,798 B1 | 11/2006 | Abe et al. | |
| 7,220,498 B2 | 5/2007 | Nagahama et al. | |
| 7,224,601 B2 | 5/2007 | Panchula | |
| 7,227,773 B1 | 6/2007 | Nguyen et al. | |
| 7,270,896 B2 | 9/2007 | Parkin | |
| 7,276,384 B2 | 10/2007 | Parkin et al. | |
| 7,453,412 B2 | 11/2008 | Murali et al. | |
| 7,492,631 B1 | 2/2009 | Assefa et al. | |
| 7,514,117 B2 | 4/2009 | Fukuzawa et al. | |
| 7,514,160 B2 | 4/2009 | Nagahama et al. | |
| 7,517,597 B2 | 4/2009 | Hinoue et al. | |
| 7,525,862 B1 | 4/2009 | Sun et al. | |
| 7,528,456 B1 | 5/2009 | Khitun et al. | |
| 7,532,504 B2 | 5/2009 | Saito | |
| 7,535,070 B2 | 5/2009 | Eshaghian-Wilner et al. | |
| 7,577,021 B2 | 8/2009 | Guo et al. | |
| 7,598,579 B2 | 10/2009 | Horng et al. | |
| 7,616,412 B2 | 11/2009 | Zhu et al. | |
| 7,678,475 B2 | 3/2010 | Slavin et al. | |
| 7,764,136 B2 | 7/2010 | Suzuki et al. | |
| 7,800,938 B2 | 9/2010 | Rivkin et al. | |
| 7,800,941 B2 | 9/2010 | Kim et al. | |
| 7,821,088 B2 | 10/2010 | Nguyen et al. | |
| 7,860,351 B2 | 12/2010 | Yagami | |
| 7,898,846 B2 | 3/2011 | Nagamine et al. | |
| 2006/0180839 A1* | 8/2006 | Fukumoto et al. | 257/295 |
| 2008/0238779 A1* | 10/2008 | Murali et al. | 343/700 MS |
| 2009/0161267 A1* | 6/2009 | Kawai et al. | 360/324.2 |
| 2010/0033881 A1 | 2/2010 | Carey et al. | |
| 2011/0084347 A1 | 4/2011 | Shin et al. | |
| 2011/0262634 A1* | 10/2011 | Nagamine et al. | 427/131 |

OTHER PUBLICATIONS

Shoji Ikeda, et al. Magnetic Tunnel Junctions of Spintronic Memories and Beyond, Internet, IEEE Transactions on Electron Devices, vol. 54, No. 5, May 2007, pp. 991-1002.
Patryk Krzysteczko, et al. Memristive Switching of MgO Based MagneticTunnel Junctions, Appl. Phys. Lett. 95, 112508, Jul. 21, 2009, pp. 1-12.
Joo-Von Kim, Tiberkevich, A. Slavin,"Generation linewidth of an auto-oscillator w/ a nonlinear frequency shift:spin-torque nano-oscillator", Phys.Rev.Lett.100,017207 (2008).
E.Bankowski, G.Gerhart, V.Tiberkevich, & A.N. Slavin, "Phase-locking and frustration in an array of nonlinear spin-torque nano-oscillators," Appl Phys. Lett, 95 262505 (2009).
A.Slavin, V.Tiberkevich, E.Bankowski, "Magnetic sensor for detection of ground vehicles", Proceedings of the Army Science Conference (ASC), Dec. 27-30, 2006, Orlando, FL.
Prokopenko, Bankowski, Meitzler, Tiberkevich & Slavin,"Spin-torque nano-oscillator as a microwave signal source", submitted to IEEE MagneticsLett.inAugust2010, vol. 2(2011)3000104.
Gerhart,Bankowski,Melkov,Slavin,Tiberkevich,"Angular dependence of the microwave generation threshold in a nanoscale spin-torque oscillator",Phys.Rev.B journal76,024437(2007).
Romeo & Citro, "Spin-torque generation by dc or ac voltages in quasi-one-dimensional magnetic layered structures", Phys.Rev.B 81, 045307 (2010).
Prokopenko, Melkov, Bankowski, Meitzler, Tiberkevich & Slavin," Noise properties of a resonanace-type spin-torque microwave detector",Appl. Phys. Lett. 99, 032507 (2011).
Cheng, Boone, Zhu & Krivorotov, "Nonadiabatic Stochastic Resonance of a Nanomagnet Excited by Spin Torque", Amer. Phys. Society, Phys. Rev. Lett. 105, 047202 (2010).
Tulapurkar,Suzuki,Fukushima,Kubota,Maehara,Tsunekawa,Djayaprawira,Watanabe&Yuasa, "Spin-torque diode effect in magnetic tunnel junctions",Lett., Nature vol. 438\Nov. 17, 2005.
Shota Iishibashi, et al., "Large Diode Sensitivity of CoFeB/MgO/CoFeB Magnetic Tunnel Junctions", Applied Physics Express 3 (2010) 073001.
Dmytriiev,Meitzler,Bankowski,Slavin&Tiberkevich,"Spin wave excitations of a magnetic pillar with dipolar coupling between layers",J.Phys.:Condens.Matter 22 (2010) 136001 (6pp).
Prokopenko,et al.,"Highly Effective Spin-Torque Diode w/ Out-of-Plane Precessing Magnetic Moment",55th Annual Conf.on Magnatism & Magnetic Materials, Nov. 17, 2010,Atlanta, GA.
Ishibashi,et al,"Magnetic field angular dependence of spin torque diode voltages in magnetic tunnel junctions",IEEE 7th Int'l Symp.on MetallicMultilayersMML2010,Sep. 19-25, 2010.
Gerhart,et al.,"Control and optimization of coherence of a nano-sized spin-torque microwave oscillator for military nano-electronics",26thArmy ScienceConf.,Orlando,FL,Dec. 2008.
McCamey,et al.,"Electronic Spin Storage in an Electrically Readable Nuclear Spin Memory with a Lifetime >100 Seconds", Reports, Science, vol. 330, Dec. 17, 2010, p. 1652.
Costache & Valenzuela, "Experimental Spin Ratchet", Reports, Science, vol. 330, Dec. 17, 2010, p. 1645.
Fan, et al., "Magnetic tunnel junction based microwave detector", Applied Physics Letters 95, 122501 (2009), American Institute of Physics.
Houssameddine, et al., "Spin-torque oscillator using a perpendicular polarizer and a planar free layer", Articles, Nature Materials\Advanced Online Publ., Apr. 29, 2007, nmat1905.
Maehara3,et al,"RF properties of the magnetic tunnel junctions", SpinTransport in Cond.Matter, 23rdAnnual Nishinomiya-YukawaMemorial Int'lWorkshop,KyotoUniv.Oct. 27-Nov. 28, 2008.

\* cited by examiner

SPINTRONIC ELECTRONIC DEVICE AND CIRCUITS

GOVERNMENT INTEREST

The invention described here may be made, used and licensed by and for the U.S. government for governmental purposes without paying royalty to us. This invention was made with government support under contracts W56HZV-10-P-L638 and W56HZV-10-P-L687 awarded by the U.S. Army, and N61339-03-D-0300 awarded by the U.S. Navy. The government has certain rights in the invention.

BACKGROUND OF THE INVENTION

1. Field of the Invention

The present invention generally relates to a spin-torque (spintronic) electronic device and circuits.

2. Background Art

Conventional spin-torque electronic (spintronic) devices and related circuits that are implemented in connection with such conventional devices (i) can be difficult to manufacture, (ii) can be implemented with high current (e.g., bias currents) densities which cause unreliable operation due to breakdown over time, (iii) can have low output voltage (i.e., low sensitivity, generally), (iv) can have poor sensitivities at frequencies of interest, (v) can operate effectively only at narrow (typically resonant) frequency ranges, and other like deficiencies.

Thus, there exists a need and an opportunity for an improved spintronic device and related circuits. Such an improved device and related circuits may overcome one or more of the deficiencies of the conventional approaches.

SUMMARY OF THE INVENTION

Accordingly, the present invention may provide an improved spintronic device and related circuits that may be implemented in connection with the improved spintronic device.

According to the present invention, a spintronic electronic apparatus having a multilayer structure is provided. The apparatus includes: a substrate, and having disposed in succession upon the substrate; a bottom interface layer; a pinned layer; a tunneling barrier; a free layer; and a top interface layer, wherein the apparatus operates as a non-resonant magnetic tunnel junction in a large amplitude, out-of-plane magnetization precession regime having weakly current dependent, large diode volt-watt sensitivity when external microwave signals that exceed a predetermined threshold current and have a frequency that is lower than a predetermined level excite the magnetization precession.

The apparatus, wherein the substrate comprises $SiO_2$.

The apparatus, wherein the bottom interface layer comprises a plurality of bottom sub-layers that are disposed in succession, and the bottom interface layer provides a smooth, small crystallographic grain size, pinhole-free, conductive surface for deposition of the pinned layer.

The apparatus, wherein the bottom interface layer comprises a Ta first bottom sub-layer, a CuN second bottom sub-layer, a Ta third bottom sub-layer, a CuN fourth bottom sub-layer, a Ta fifth bottom sub-layer, a Ru sixth bottom sub-layer, and a Ta seventh bottom sub-layer.

The apparatus, wherein the first bottom sub-layer has a thickness of about 3 nm, the second bottom sub-layer has a thickness of about 40 nm, the third bottom sub-layer has a thickness of about 3 nm, the fourth bottom sub-layer has a thickness of about 40 nm, the fifth bottom sub-layer has a thickness of about 3 nm, the sixth bottom sub-layer has a thickness of about 10 nm, and the seventh bottom sub-layer has a thickness of about 5 nm.

The apparatus, wherein the pinned layer comprises a multilayer structure that comprises a $Pt_{37}Mn_{63}$ first fixed sub-layer, a $Co_{70}Fe_{30}$ second fixed sub-layer, a Ru third fixed sub-layer, and a $Co_{40}Fe_{40}B_{20}$ fourth fixed sub-layer.

The apparatus, wherein the first fixed sub-layer has a thickness of about 15 nm, the second fixed sub-layer has a thickness of about 2.3 nm, the third fixed sub-layer has a thickness of about 0.85 nm, and the fourth fixed sub-layer has a thickness of about 2.4 nm.

The apparatus, wherein the tunneling barrier comprises MgO.

The apparatus, wherein the free layer comprises $Co_{40}Fe_{40}B_{20}$.

The apparatus, wherein the free layer has a thickness of about 2.4 nm.

The apparatus, wherein the top interface layer comprises a plurality of top sub-layers that are disposed in succession away from the free layer, and the top interface layer provides a reliable, pinhole-free contact to a top lead of the apparatus.

The apparatus, wherein the top interface layer comprises a Ta first top sub-layer, a Cu second top sub-layer, a Ru third top sub-layer, and a Ta fourth top sub-layer.

The apparatus of claim, wherein the first top sub-layer has a thickness of about 5 nm, the second top sub-layer has a thickness of about 10 nm, the third top sub-layer has a thickness of about 5 nm, and the fourth top sub-layer has a thickness of about 3 nm.

The apparatus, wherein the apparatus is implemented as a detector in connection with at least one of a spintronic selective microwave frequency detection circuit, a spectrum analyzer circuit, and a frequency band identification circuit.

Also according to the present invention, an energy harvesting apparatus is provided. The apparatus includes: at least one spintronic electronic device having a multilayer structure, the device comprising: a substrate, having disposed in succession upon the substrate; a bottom interface layer; a pinned layer; a tunneling barrier; a free layer; and a top interface layer, wherein the device operates as a non-resonant magnetic tunnel junction in a large amplitude, out-of-plane magnetization precession regime having weakly current dependent, large diode volt-watt sensitivity when external microwave signals that exceed a predetermined threshold current and have a frequency that is lower than a predetermined level excite the magnetization precession; an antenna having two legs; and a load having two ends, wherein the device is electronically coupled in parallel to the legs of the antenna and to the ends of the load.

Further, according to the present invention, a multilayer electronic device is provided. The device includes: a substrate, and having disposed in succession upon the substrate; a bottom interface layer; a pinned layer; a tunneling barrier; a free layer; and a top interface layer, and when external microwave signals excite a magnetization precession, the device operates as a spintronic, non-resonant magnetic tunnel junction.

The electronic device, wherein the device operates in a large amplitude, out-of-plane magnetization precession regime when the external microwave signals that excite the magnetization precession exceed a predetermined threshold current and have a frequency that is lower than a predetermined level.

The electronic device, wherein the device has weakly current dependent large diode volt-watt sensitivity.

The electronic device, wherein the bottom interface layer comprises a plurality of bottom sub-layers that are disposed in succession, and the bottom interface layer provides a smooth, small crystallographic grain size, pinhole-free, conductive surface for deposition of the pinned layer.

The electronic device, wherein the top interface layer comprises a plurality of top sub-layers that are disposed in succession away from the free layer, and the top interface layer provides a reliable, pinhole-free contact to a top lead of the device.

The above features, and other features and advantages of the present invention are readily apparent from the following detailed descriptions thereof when taken in connection with the accompanying drawings.

DETAILED DESCRIPTION OF THE PREFERRED EMBODIMENT(S)

Definitions and Terminology

The following definitions and terminology are applied as understood by one skilled in the appropriate art.

The singular forms such as "a," "an," and "the" include plural references unless the context clearly indicates otherwise. For example, reference to "a material" includes reference to one or more of such materials, and "an element" includes reference to one or more of such elements.

As used herein, "substantial" and "about", when used in reference to a quantity or amount of a material, characteristic, parameter, and the like, refer to an amount that is sufficient to provide an effect that the material or characteristic was intended to provide as understood by one skilled in the art. The amount of variation generally depends on the specific implementation. Similarly, "substantially free of" or the like refers to the lack of an identified composition, characteristic, or property. Particularly, assemblies that are identified as being "substantially free of" are either completely absent of the characteristic, or the characteristic is present only in values which are small enough that no meaningful effect on the desired results is generated.

A plurality of items, structural elements, compositional elements, materials, subassemblies, and the like may be presented in a common list or table for convenience. However, these lists or tables should be construed as though each member of the list is individually identified as a separate and unique member. As such, no individual member of such list should be considered a de facto equivalent of any other member of the same list solely based on the presentation in a common group so specifically described.

Concentrations, values, dimensions, amounts, and other quantitative data may be presented herein in a range format. One skilled in the art will understand that such range format is used for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 dimensional unit to about 100 dimensional units should be interpreted to include not only the explicitly recited limits, but also to include individual sizes such as 2 dimensional units, 3 dimensional units, 10 dimensional units, and the like; and sub-ranges such as 10 dimensional units to 50 dimensional units, 20 dimensional units to 100 dimensional units, and the like.

With reference to the Figures, the preferred embodiments of the present invention will now be described in detail. Generally, the present invention provides an improved system for spin-torque electronic (spintronic, nanoelectronic, nanospintronic, and the like) devices, and related circuits that may be implemented in connection with the improved spintronic devices. One of ordinary skill in the art is presumed to have knowledge of conventional spintronics devices, and the related manufacture and operation thereof.

Figure 1:
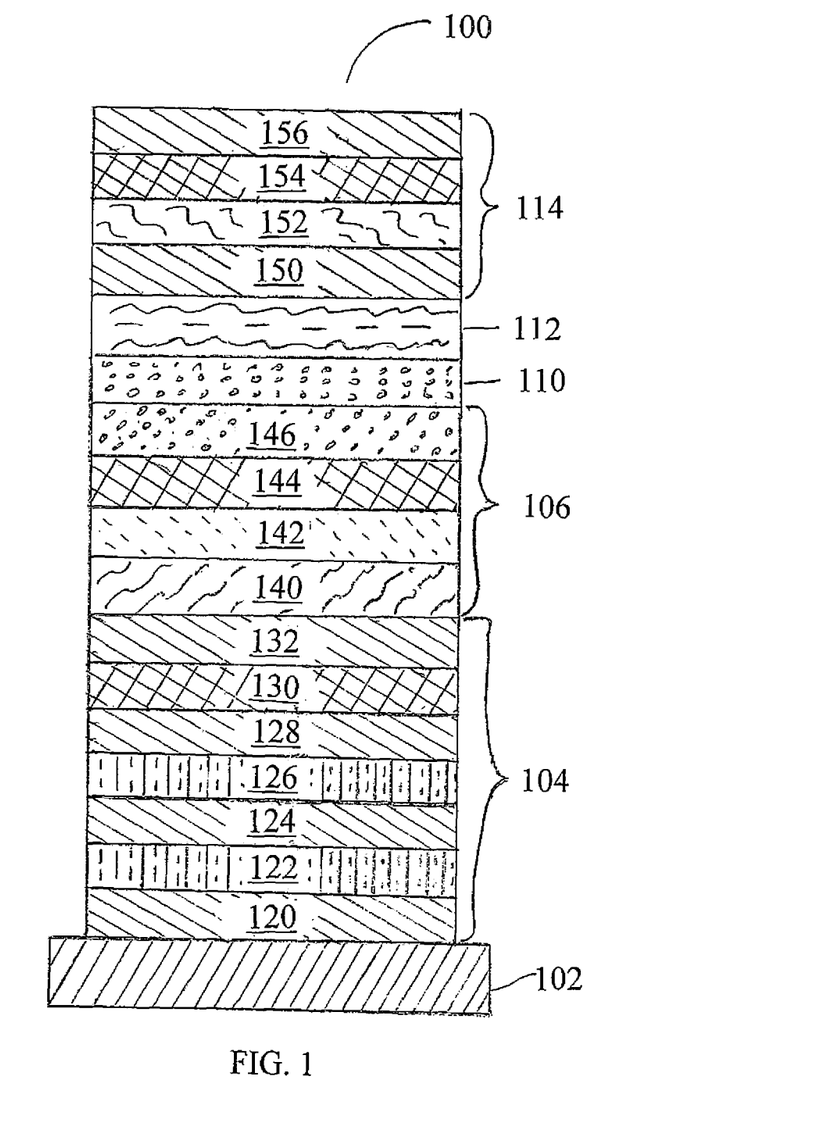
FIG. 1 is a diagram of a cross-sectional view of an embodiment of a spintronic device of the present invention.

Referring to FIG. 1, a diagram of a cross-sectional view illustrating the multilayer structure of an embodiment of an electronic device (e.g., apparatus, system, circuit, etc.) 100 of the present invention is shown. The apparatus 100 generally comprises a substrate 102 having disposed (i.e., positioned, layered, stacked, built up, deposited, etc.) in succession upon the substrate (i.e., from or away from the substrate 102 generally upward, above, etc.) a bottom interface layer (e.g., buffer, undercoat, etc.) 104, a synthetic antiferromagnet (SAF) pinned (fixed) layer 106, a tunnel (tunneling) microwave resistance (TMR) barrier (intermediate) layer 110, a free layer 112, and a top interface layer (e.g., over layer, capping layer) 114. The pinned layer 106 and the free layer 112 may be entirely made of a ferromagnet material and/or may include one or more ferromagnet material sub-layers. As used herein, "pinning" may be defined as the phenomenon that occurs when an antiferromagnet in the vicinity of a ferromagnetic film fixes the magnetic moment of the ferromagnetic film, thereby "pinning" the magnetic moment, otherwise known as "exchange bias".

The apparatus 100 may be produced (i.e., the layers 104, 106, 110, 112, and 114 may be disposed) via semiconductor manufacturing techniques (e.g., sputtering, etching, annealing, and the like) that are well known to one of ordinary skill in the relevant art.

The apparatus 100 is generally implemented as a (spin-torque) spintronic device; and, in particular, as a magnetic tunnel junction (MTJ) multilayer structure. As described below in connection with FIGS. 2-5, the apparatus 100 may be implemented as a spintronic microwave detector where external microwave signals generally excite magnetic precession with a large angle when the external microwave signals exceed a predetermined threshold amount and the external microwave signals have a frequency that is lower than a predetermined level. As described below in connection with FIGS. 2-7, the device 100 may be advantageously implemented in connection with electronic circuits that may perform microwave energy harvesting, selective microwave frequency detection, frequency band identification, etc.

The substrate 102 generally comprises silicon dioxide ($SiO_2$) or any other appropriate electronic circuit substrate material that are well known to one of ordinary skill in the relevant art.

In one example, the undercoat 104 comprises a multilayer structure. The bottom interface layer 104 generally includes a plurality of bottom sub-layers that are disposed (i.e., positioned, layered, etc.) in succession away from the substrate 102 comprising a Ta first bottom sub-layer 120 having a thickness of about 3 nm, a CuN second bottom sub-layer 122 having a thickness of about 40 nm, a Ta third bottom sub-layer 124 having a thickness of about 3 nm, a CuN fourth bottom sub-layer 126 having a thickness of about 40 nm, a Ta fifth bottom sub-layer 128 having a thickness of about 3 nm, a Ru sixth bottom sub-layer 130 having a thickness of about 10 nm, and a Ta seventh bottom sub-layer 132 having a thickness of about 5 nm. The bottom layer 104 generally provides a very smooth (i.e., small crystallographic grain size) conductive surface for deposition of a pinhole-free, magnetic tunnel junction 106 on top.

The SAF (fixed, pinned) layer 106 comprises a multilayer structure. The fixed layer 106 generally includes a plurality of sub-layers that are disposed (i.e., positioned, layered, etc.) in succession comprising a $Pt_{37}Mn_{63}$ first fixed sub-layer 140 having a thickness of about 15 nm, a $Co_{70}Fe_{30}$ second fixed sub-layer 142 having a thickness of about 2.3 nm, a Ru third fixed sub-layer 144 having a thickness of about 0.85 nm, and a $Co_{40}Fe_{40}B_{20}$ fourth fixed sub-layer 146 having a thickness of about 2.4 nm.

The tunneling barrier 110 comprises MgO.

The free layer 112 comprises $Co_{40}Fe_{40}B_{20}$ and may have a thickness of about 2.4 nm.

The top layer 114 comprises a multilayer structure. The capping interface layer 114 generally includes a plurality of top sub-layers that are disposed (i.e., positioned, layered, etc.) in succession away from the free layer 112 comprising a Ta first top sub-layer 150 having a thickness of about 5 nm, a Cu second top sub-layer 152 having a thickness of about 10 nm, a Ru third top sub-layer 154 having a thickness of about 5 nm, and a Ta fourth top sub-layer 156 having a thickness of about 3 nm. The top 114 generally provides a reliable, pinhole-free contact to the top lead of the tunnel junction device 100.

In contrast to conventional approaches, the device 100 may operate as a spin-torque microwave detector (STMD) in a different (alternate) mode (regime) of operation, wherein the different regime (mode) of operation is based on excitation of large-angle out-of-plane (OOP) magnetization precession. The performance of the STMD 100 in the OOP regime may be superior when compared to conventional (e.g., in plane—IP regime) approaches.

The detector 100 generally operates as a non-resonant, broadband, threshold microwave detector in a wide range of low frequencies. The OOP regime of operation of the STMD 100 is non-resonant in frequency (i.e., exists for all frequencies that are below certain critical frequency determined by the bias magnetic field). A very high V/W sensitivity of the STMD 100 is expected in the OOP regime when the power of the external signal is close to the threshold power of the device 100.

The OOP mode of operation for the STMD 100 generally exists (occurs, results) for resonant frequency (RF) currents with amplitudes $I_{RF} > I_{CR}(\omega)$, and is generally stable for the frequencies of RF signal $\omega < \omega_{CR}$ (i.e., so-called critical frequency). The output DC voltage $U_{DC}$ of such a STMD 100 generally has a step-like behavior, that is, the voltage $U_{DC}$ is generally near zero for $I_{RF} < I_{CR}(\omega)$ and may weakly depend on $I_{RF}$ when $I_{RF} > I_{CR}(\omega)$. The OOP regime of operation of the STMD 100 may be used to produce (i.e., in connection with) threshold microwave detectors with large differential sensitivity near the critical frequency (threshold frequency).

Figure 2:
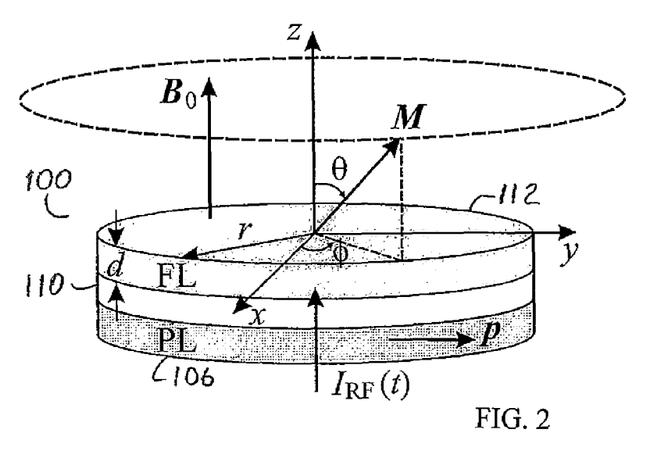
FIG. 2 is an isometric view of the device of FIG. 1, illustrating the operation of the device of FIG. 1.

Referring to FIG. 2, an isometric view illustrating the operation of the device 100 in the OOP mode is shown. The system 100, as illustrated in FIG. 2, comprises a circular nano-pillar having a radius, r, and further comprises the free magnetic layer (FL) 112 having a thickness, d, the TMR barrier 110, and the pinned magnetic layer (PL) 106. In response to a radio frequency (RF) current $I_{RF(t)} = I_{RF} \sin(\omega t)$, magnetization M precesses along a large-angle out-of-plane (OOP) trajectory about the direction of a weak DC magnetic field $B_0 = \hat{z}B_0$ ($B_0 < \mu_0 Ms$), where $\mu_0$ is the vacuum permeability, Ms is the saturation magnetization of the FL 112, and p is the unit vector in the direction of the magnetization of the PL 106.

The mode of operation of the STMD 100 is generally based on excitation of large-angle out-of-plane (OOP) magnetization precession in response to the action of the microwave current $I_{RF(t)}$. FIG. 2 illustrates that such regime of operation of STMD 100 may be substantially different than the conventional regime (i.e., the IP regime) of operation of a conventional STMD. In particular, the regime (mode) with OOP magnetization precession (i.e., OOP-regime) is generally characterized by the following features:

(a) operation of the STMD 100 as a non-resonant threshold broadband microwave detector for input RF currents $I_{RF}$ larger than the critical current $I_{CR}(\omega)$ (i.e., $I_{RF} > I_{CR}(\omega)$);

(b) a stable OOP-regime exists for low frequency input signals with frequencies $\omega < \omega_{CR}$, where $\omega_{CR}$ is the critical frequency; and (c) the output DC voltage $U_{DC,OOP}$ weakly depends on the magnitude of input RF current $I_{RF} > I_{CR}(\omega)$.

Herein, the OOP-regime of operation of the STMD 100 is modeled and described with the following considerations:

(a) a macro-spin approach is implemented for the mathematical analysis;

(b) the analyzed magnetic tunnel junction (MTJ) section of the device 100 is the circular nano-pillar having no in-plane anisotropy;

(c) induction of DC magnetic field $B_0$ is perpendicular to the plane of the FL 112 of MTJ ($B_0 = \hat{z}B_0$) and is smaller than the saturation field, i.e. $B_0 < \mu_0 Ms$;

(d) magnetization of the PL 106 is in plane of MTJ (i.e., along the $\hat{x}$ axis); and (e) no DC bias current is presented to the device 100.

The dynamics of the magnetization $M \equiv M(t)$ of the FL 112 in response to the microwave current $I_{RF}(t) = I_{RF} \sin(\omega)$ may be described by the Landau-Lifshits-Gilbert-Slonczewski equation:

$$dM/dt = \gamma[B_{\mathit{eff}} \times M] + (\alpha/Ms)[M \times dM/dt] + (\sigma I_{RF}/Ms)\sin(\omega t)[M \times [M \times p]], \qquad \text{(Eq. 2)}$$

where $B_{\mathit{eff}}$ is the effective magnetic field, which has contributions from an external DC magnetic field $B_0 = \hat{z}B_0$ and the demagnetization field, $\alpha$ is the Gilbert damping constant, $\sigma = \sigma\perp/(1+P^2 \cos\beta)$ is the current-torque proportionality coefficient, $\sigma\perp = (\gamma\hbar/2e)P/(MsV)$, $\hbar$ is the reduced Planck constant, e is the modulus of the electron charge, P is the spin-polarization of current, $\beta$ is the angle between the directions of magnetization in the FL 112 and PL 106, $V = \pi r^2 d$ is the volume of the FL 112 (r is the radius and d is thickness of the FL 112), and $p = \hat{x}$ is the unit vector in the direction of the magnetization of the PL 106.

The magnetization M may be represented in the form $M = Ms (\hat{x}\sin\theta\cos\phi + \hat{y}\sin\theta\sin\phi + \hat{z}\cos\theta)$ and find the equations for $\theta$ and $\phi$, where $\theta \equiv \theta(t)$ is the out-of-plane (OOP)

angle between the magnetization and $\hat{z}$ axis, $\phi\equiv\phi(t)$ is the in-plane angle between the magnetization projection on the $\hat{x}-\hat{y}$ plane and the $\hat{x}$ axis. Note, that in response to the RF current, the magnetization vector generally precesses with the angular frequency $\omega$ of the RF current; however, the significant influence of RF current on the motion of magnetization is observed only if the average value of this action is non-zero. Therefore $\phi$ may be represented in the form $\phi=\omega t+\tilde{\phi}$, the equations for $\theta$ and $\phi$ may be averaged over the period $2\pi/\omega$ of RF current oscillations, and, after neglecting small terms ($\sim\alpha^2$) the following equations may be obtained:

$$d\theta/dt=-\alpha\omega(\theta)\sin\theta-(\sigma\perp I_{RF}/2)\times(\alpha\mu\cos\tilde{\phi}-\nu\cos\theta\sin\tilde{\phi}),\quad\text{(Eq. 3a) and}$$

$$d\tilde{\phi}/dt=\omega(\theta)-\omega+(\sigma\perp I_{RF}/2)\times(\mu\csc\theta\cos\tilde{\phi}+\alpha\nu\cot\theta\sin\tilde{\phi}),\quad\text{(Eq. 3b)}$$

where $\omega(\Theta)=\omega_H-\omega_M\cos\theta$ is the frequency of OOP precession, $\omega_H=\gamma B_0$, $\omega_M=\gamma\mu_0 M_s$, $\mu=(1-P^4)^{-1/2}[1-P^{-4}(\sqrt{(1-P^4)}-1)^2]$, $\nu=(1-P^4)^{-1/2}[1+P^{-4}(\sqrt{(1-P^4)}-1)^2]$, $\mu$, $\nu\sim 1$ for $P\leq 0.7$.

The stationary solution is $\theta=\theta s$, $\tilde{\phi}s=\omega t+\tilde{\phi}s$. In the case assuming $\theta s\approx\pi/2$, the OOP precession mode generally occurs for microwave currents $I_{RF}$ larger than the critical value $$I_{CR}(\omega)\approx(2\alpha/\nu)(\Omega_M/\sigma\perp)((\omega/(\omega_H-\omega)).\quad\text{(Eq. 4)}$$

Also, the OOP precession is generally stable for low frequencies $\omega<\omega_{CR}=\omega_H$. Thus, the STMD 100 generally operates as a broadband threshold microwave detector in the OOP-regime for input RF signals having frequencies $\omega<\omega_H$ and currents $I_{RF}>I_{CR}(\omega)$.

When the angular dependence of MTJ resistance is $R(\beta)=R\perp/(1+P^2\cos\beta)$, the output DC voltage of the STMD 100 operating in the 00P mode may be calculated as:

$$U_{DC,OOP}=-I_{RF}R\perp w\sin\tilde{\phi}s\approx-I_{CR}(\omega)R\perp w,\quad\text{(Eq. 5)}$$

where $w=(1-P^4)^{-1/2}P^{-2}(\sqrt{(1-P^4)}-1)<0$.

Per Eq. (5), the output DC voltage $U_{DC,OOP}$ in the OOP mode of operation of the device 100 generally weakly depends on input microwave power $P_{RF}\approx I^2_{RF}R_0/2$, where $R_0=R\perp w_0$, $w_0=(1-P^4)^{-1/2}$.

Accordingly, the sensitivity of the detector $$\epsilon_{OOP}=U_{DC,OOP}/P_{RF}\approx-2(1/I_{RF})(I_{CR}(\omega)/I_{RF})(w/w_0)$$

has a maximum value $\epsilon_{OOP,max}=-2ww_0^{-1}I_{CR}^{-1}(\omega)$ at the threshold input current (i.e., $I_{RF}=I_{CR}(\omega)$), and is rapidly decreased for input microwave signals having greater power.

For typical parameters of an experiment (e.g., r=50 nm, d=1 nm, P=0.7, $R\perp$=500 $\Omega$, $\alpha$=0.01, $\mu_0 M_s$=800 mT, $B_0$=200 mT (giving $\omega_H/2\pi\approx 5.6$ GHz), $\omega/2\pi$=2 GHz), the maximum sensitivity in the passive OOP regime $\epsilon_{OOP,max}\approx 3000$ V/W, which is comparable to or better than the sensitivity of the conventional STMD operating in the IP-regime.

Figure 3:
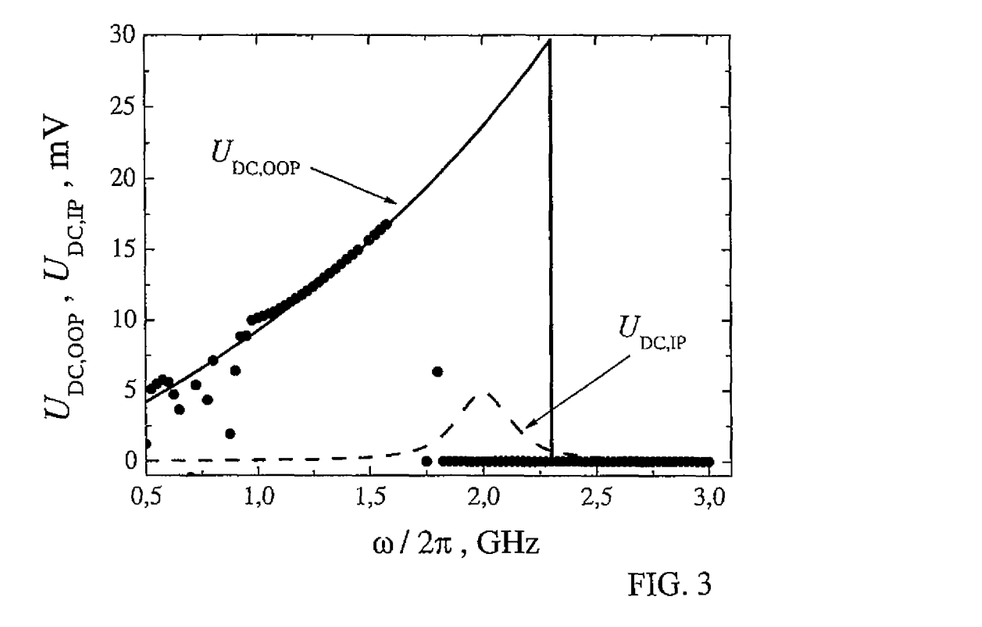
FIG. 3 is a plot illustrating a comparison of the output DC voltage from conventional in-plane operation and out-of-plane operation according to the device of FIG. 1 versus input signal frequency.

Referring to FIG. 3, a plot illustrating the dependence of the output DC voltage $U_{DC,OOP}$ (solid line and points), $U_{DC,IP}$ (dashed line) of a STMD versus (in response to, with respect to) frequency of the input RF signal $\omega/2\pi$ in the OOP- and IP-regimes, respectively, is shown. The solid lines depict the analytical dependencies (see, Eqs. (5) and (1), respectively), and the points are the results of numerical simulations. $I_{RF}$=0.2 mA, all other parameters are the same as previously indicated in connection with Eq. (6) except that $B_0$=6.3 mT ($\omega_{res}\approx 2$ GHz), $R_0=R(\beta_0)$, $\beta_0=\pi/4$ for the conventional IP-regime.

Figure 4:
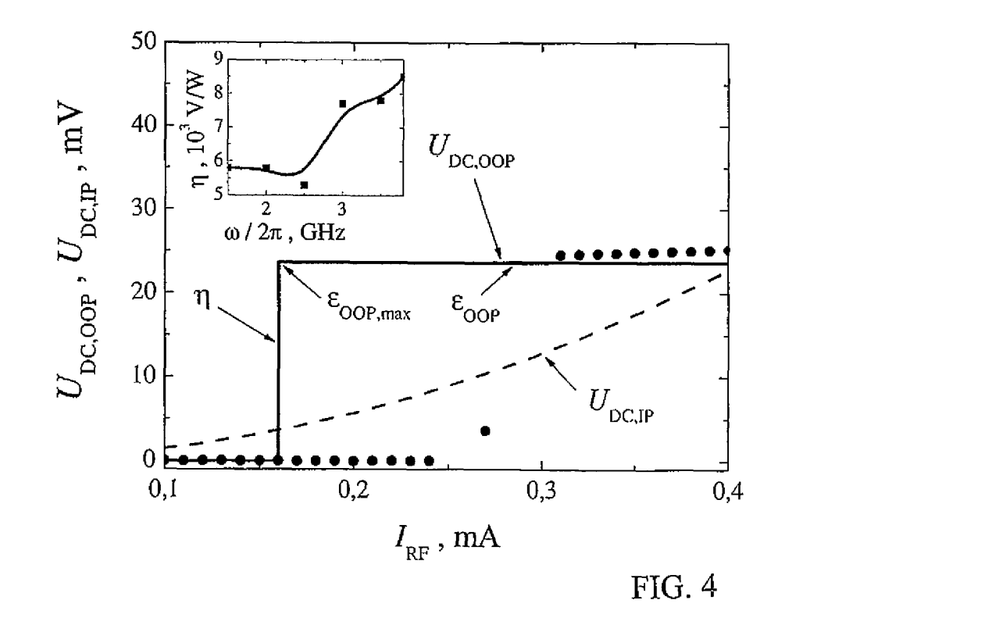
FIG. 4 is a plot illustrating a comparison of the dependence of the output DC voltage from conventional in-plane operation and out-of-plane operation according to the device of FIG. 1 versus input current level, and an Inset illustrating differential sensitivity versus input signal frequency.

Referring to FIG. 4, a plot depicting the dependence of the output DC voltage $U_{DC,OOP}$ (solid line and points), $U_{DC,IP}$ (dashed line) of a STMD versus input microwave current $I_{RF}$ in the OOP and IP regimes, respectively, is shown. The solid lines are the analytical dependencies (see, Eqs. (5) and (1), respectively), the points are the results of numerical simulations, where, $\omega/2\omega\pi$=2 GHz, and all other parameters are the same as previously indicated in connection with Eq. (6) except as noted above in connection with FIG. 3. The Inset on FIG. 4 depicts the calculated dependence of differential volt-watt sensitivity of the STMD $\eta$ (in $10^3$ V/W) versus frequency $\omega/2\pi$ of the input microwave (RF) signal in the OOP-regime at the threshold $I_{RF}=I_{CR}(\omega)$.

Referring to both FIGS. 3 and 4 together, the dependence of the output DC voltage with respect to the frequency of the input RF signal $\omega/2\pi$ it is shown on FIG. 3 for the case of the OOP-regime (solid line and dots), and the conventional IP-regime (dashed line) modes of operation of a STMD. The STMD 100 generally performs as broadband low frequency non-resonant microwave detector in the OOP regime in contrast to the resonance STMD of the conventional, IP mode of operation.

The response of the STMD versus input microwave signals with different magnitude, $I_{RF}$, is also substantially different in the case of OOP- and IP-regimes of operation of the STMD (see, FIG. 4). In the conventional IP-regime of operation the output DC voltage $U_{DC,IP}$ of the diode is proportional to the input power $P_{RF}\sim I_{RF}^2$ (dashed line on FIG. 4, see also Eq. (1)).

In contrast, the output DC voltage $U_{DC,OOP}$ of the diode 100 in the OOP-regime of operation has a step-like dependence (solid line and points on FIG. 4); that is, $U_{DC,OOP}\approx 0$ for $I_{RF}<I_{CR}(\omega)$, and $U_{DC,OOP}\approx\epsilon_{OOP,max}I_{CR}(\omega)$ for $I_{RF}>I_{CR}(\omega)$.

Thus, in the OOP-regime of operation the STMD 100 generally operates as a non-resonant broadband threshold microwave detector of low frequency RF signals. Although the theory presented above predicts the sharp step-like behavior of $U_{DC}(I_{RF})$ near the threshold, the numerical simulation shows that voltage sharply changes for input signals with magnitude $I_{RF}\approx I_{CR}(\omega)$; however, the differential volt-watt sensitivity $$\eta=\Delta U_{DC}/\Delta P_{RF}$$

at the threshold remains finite (see, Inset on FIG. 4).

The results presented above correspond to the case of no DC bias current applied to the MTJ 100 (i.e., $I_{DC}$=0). When $I_{DC}\neq 0$, a supplied DC bias current may partially or completely compensate damping in the MTJ 100. The damping may lead to the decrease of critical current $I_{CR}(\omega)$. However, in-plane anisotropy and/or in-plane bias field may create an energy barrier between regions of small-angle IP-, and large-angle OOP trajectories, which may be overcome by thermal fluctuations or by supplying a DC bias current. Thus, a large-angle OOP-regime of operation of a STMD 100 in a real anisotropic system may be thermally activated or DC bias current activated. The STMD 100 operating in the OOP-regime can be implemented as a threshold microwave detector with sufficient differential sensitivity near the threshold, and also for energy harvesting applications. The OOP-regime of operation of a STMD 100 may provide extremely large diode volt-watt sensitivity. For example, $\epsilon\sim 10^5$ V/W has been observed in connection with thermally-activated, non-adiabatic stochastic resonance.

Figure 5:
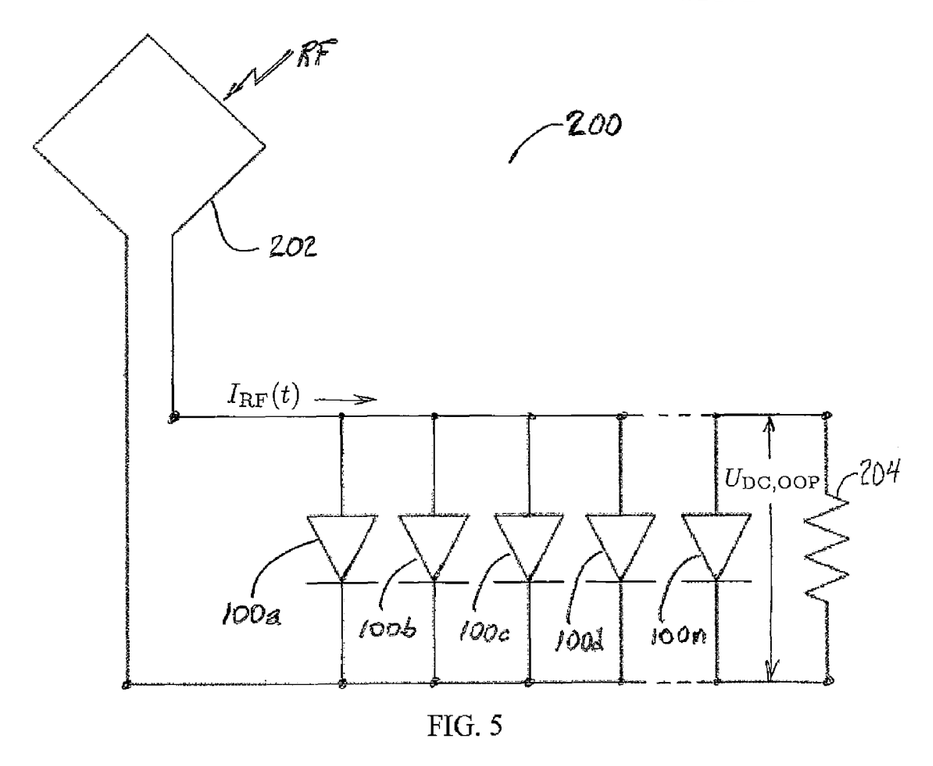
FIGS. 5-7 are electrical schematic drawings of apparatuses that may implement the device of FIG. 1.

Referring to FIG. 5, an electrical schematic drawing of an electronic device (e.g., apparatus, system, circuit, etc.) 200 is shown. The apparatus 200 comprises at least one of the device 100 (e.g., devices 100a, 100b, 100c, 100d, . . . , and 100n), an antenna 202 having two legs, and a load 204 having two ends. The devices 100 are generally electronically coupled in parallel to each other and to the two legs of the antenna 200, and to the two ends of the load 204.

When a radio frequency wave (e.g., a beam of microwave energy), RF, impinges on the antenna 202, the AC current $I_{RF}$ (t) may be generated. The device 100 may operate in the OOP mode and perform as a diode, as described above in connection with FIGS. 2-4. A DC voltage (e.g., the output DC voltage $U_{DC,OOP}$) may be generated by the device 100, and presented to the load 204. As such, the circuit 200 may be advantageously implemented as an energy harvesting device.

Figure 6:
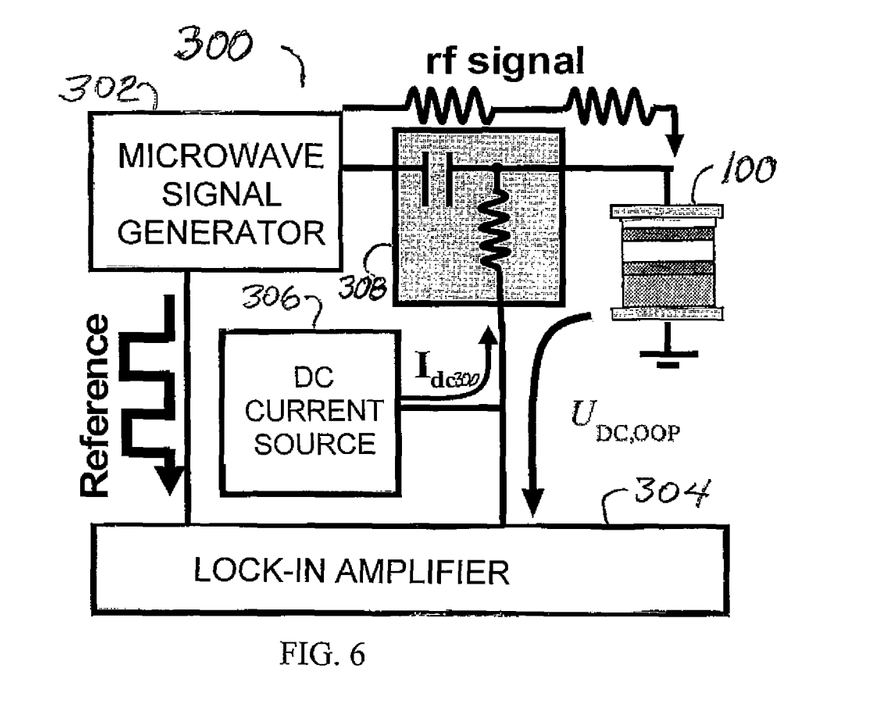

In another example, the device 100 may perform as a diode (e.g., detector), and may be advantageously implemented in connection with a spintronic selective microwave frequency detection circuit (see, for example, circuit 300 on FIG. 6). The circuit 300 includes the diode 100, a microwave generator 302, a lock-in amplifier 304, a DC current source 306, and a filter ("bias tee") 308.

The microwave generator 302 may present a reference signal. Reference, to a first input of the lock-in amplifier 304, and may also present an RF signal to a first input of the filter 308. The current source 306 may have an output that presents a DC current $Idc_{300}$ to a second input of the filter 308 and that is also electrically coupled to a second input of the lock-in amplifier 304. The diode 100 may receive as an input the RF signal from an output of the filter 308, and may be electrically coupled between circuit ground and the output of the filter circuit 308 such that a DC voltage, $U_{DC,OOP}$, is presented to the second input of the lock-in amplifier 304.

Figure 7:
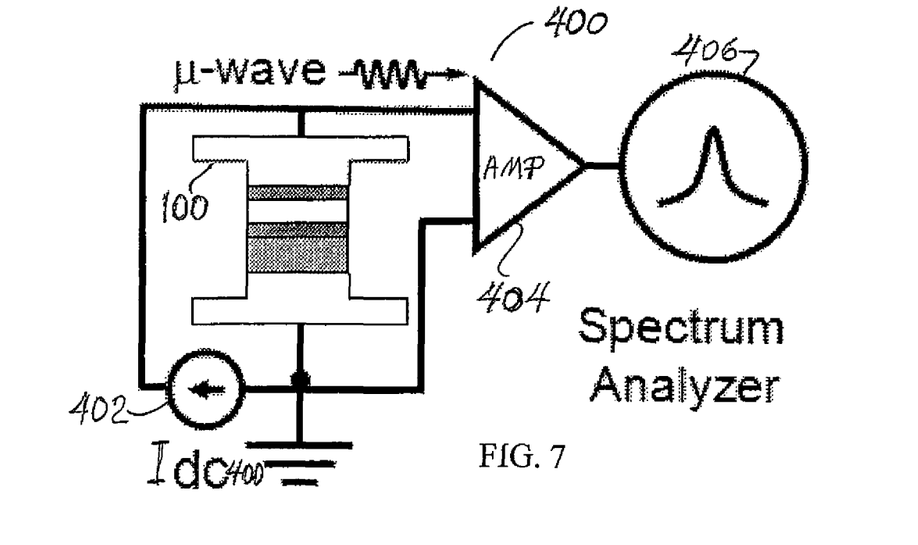

In yet another example, the device 100 may perform as a diode (e.g., detector), and may be advantageously implemented in connection with a spectrum analyzer circuit (see, for example, circuit 400 on FIG. 7). The circuit 400 includes the diode 100, a DC current source 402, an amplifier 404, and a display 406.

At a first end, the current source 402 may be electrically coupled to circuit ground, and may be electrically coupled to present from a second end (i.e., an output), a DC current, $Idc_{400}$, to a first end of the diode 100 and a first input leg of the amplifier 404. The second end of the diode 100 may be electrically coupled to the circuit ground and a second input leg of the amplifier 404.

The diode 100 may receive as an input a microwave signal at the first end, and may be electrically coupled to the first input leg of the amplifier 404. The diode 100 is generally responsive to the microwave signal as described above in connection with FIGS. 1-5 such that an output of the amplifier 404 that is coupled to an input of the display 406 produces a display (e.g., video image, printed output, plot, etc.) of the frequency spectrum of the microwave signal.

In yet other examples, the device 100 perform as a diode and/or detector, and may be advantageously implemented in connection with a frequency band identification circuit; etc.; as would be known to one of skill in the art.

As is apparent then from the above detailed description, the present invention may provide an improved spintronic device and related circuits.

The apparatus 100 may be implemented as a spintronic microwave detector where external microwave signals excite magnetization precession with a large angle when the external microwave signal amplitude exceeds a certain threshold and the external microwave signal frequency is lower than a certain threshold frequency that is generally determined by the magnitude of a bias magnetic field.

Furthermore, the device 100 may demonstrate a regime of operation as a spin-torque diode, based on excitation of large-angle out-of-plane magnetization precession. The specific features of the spin-torque diode 100 may include: Threshold character of excitation, $I_{RF} > I_{CR}(\omega)$; Excitation is stable in a wide region of low frequencies; Large output voltage (e.g., >>1 mV), which generally weakly depends on the amplitude of the input AC current. The apparatus 100 may demonstrate that the out-of-plane (OOP) precession regime (mode of operation) can generate extremely large diode efficiencies with non-adiabatic stochastic resonance.

Conventional active devices may implement high current densities. Over time, the conventional devices can become unreliable due to breakdown. In contrast, the device 100 is a passive device, which may implement (receive) an incoming microwave radio frequency field as an input. The device 100 may generate an output that comprises a DC voltage. Therefore, the device 100 generally works in a large range of frequencies and may provide a large DC output signal that is nearly independent of the input power, as long as the input power exceeds a critical level, $P_{critical}$.

The structure and material of the layers implemented in the device 100 generally provide pin-hole free, smooth, reliable, robust interfaces at the top and bottom.

Various alterations and modifications will become apparent to those skilled in the art without departing from the scope and spirit of this invention, and it is understood this invention is limited only by the following claims.

What is claimed is:

1. A spintronic electronic apparatus having a multilayer structure, the apparatus comprising:
    a substrate, wherein the substrate comprises $SiO_2$, and having disposed in succession upon the substrate;
    a bottom interface layer, wherein the bottom interface layer comprises a plurality of bottom sub-layers that are disposed in succession, and the plurality of bottom sub-layers comprises a Ta first bottom sub-layer, a CuN second bottom sub-layer, a Ta third bottom sub-layer, a CuN fourth bottom sub-layer, a Ta fifth bottom sub-layer, a Ru sixth bottom sub-layer, and a Ta seventh bottom sub-layer, and, wherein the first bottom sub-layer has a thickness of about 3 nm, the second bottom sub-layer has a thickness of about 40 nm, the third bottom sub-layer has a thickness of about 3 nm, the fourth bottom sub-layer has a thickness of about 40 nm, the fifth bottom sub-layer has a thickness of about 3 nm, the sixth bottom sub-layer has a thickness of about 10 nm, and the seventh bottom sub-layer has a thickness of about 5 nm;
    a pinned layer, wherein the pinned layer comprises a plurality of fixed sub-layers that are disposed in succession, the plurality of fixed sub-layers comprises a $Pt_{37}Mn_{63}$ first fixed sub-layer, a $Co_{70}Fe_{30}$ second fixed sub-layer, a Ru third fixed sub-layer, and a $Co_{40}Fe_{40}B_{20}$ fourth fixed sub-layer, and the first fixed sub-layer has a thickness of about 15 nm, the second fixed sub-layer has a thickness of about 2.3 nm, the third fixed sub-layer has a thickness of about 0.85 nm, and the fourth fixed sub-layer has a thickness of about 2.4 nm;
    a tunneling barrier, wherein the tunneling barrier comprises MgO, and has a thickness of about 2.4 nm;
    a free layer, wherein the free layer comprises $Co_{40}Fe_{40}B_{20}$, and has a thickness of about 2.4 nm; and
    a top interface layer, wherein the top interface layer comprises a plurality of top sub-layers that are disposed in succession away from the free layer, the plurality of top sub-layers comprise a Ta first top sub-layer, a Cu second top sub-layer, a Ru third top sub-layer, and a Ta fourth top sub-layer, and the first top sub-layer has a thickness of about 5 nm, the second top sub-layer has a thickness of about 10 nm, the third top sub-layer has a thickness of about 5 nm, and the fourth top sub-layer has a thickness of about 3 nm, wherein the apparatus operates as a non-resonant magnetic tunnel junction in a large amplitude, out-of-plane magnetization precession regime having weakly current dependent, large diode volt-watt sensitivity when external microwave signals that exceed a predetermined threshold current and have a frequency that is lower than a predetermined level excite the magnetization precession.

2. The apparatus of claim 1, wherein the apparatus is implemented as a detector in connection with at least one of a spintronic selective microwave frequency detection circuit, a spectrum analyzer circuit, and a frequency band identification circuit.

3. An energy harvesting apparatus, the apparatus comprising:

at least one spintronic electronic device having a multilayer structure, the device comprising:

a substrate, wherein the substrate comprises $SiO_2$, and having disposed in succession upon the substrate;

a bottom interface layer, wherein the bottom interface layer comprises a plurality of bottom sub-layers that are disposed in succession, and the plurality of bottom sub-layers comprises a Ta first bottom sub-layer, a CuN second bottom sub-layer, a Ta third bottom sub-layer, a CuN fourth bottom sub-layer, a Ta fifth bottom sub-layer, a Ru sixth bottom sub-layer, and a Ta seventh bottom sub-layer, and, wherein the first bottom sub-layer has a thickness of about 3 nm, the second bottom sub-layer has a thickness of about 40 nm, the third bottom sub-layer has a thickness of about 3 mm, the fourth bottom sub-layer has a thickness of about 40 nm, the fifth bottom sub-layer has a thickness of about 3 nm, the sixth bottom sub-layer has a thickness of about 10 nm, and the seventh bottom sub-layer has a thickness of about 5 nm;

a pinned layer, wherein the pinned layer comprises a plurality of fixed sub-layers that are disposed in succession, the plurality of fixed sub-layers comprises a $Pt_{37}Mn_{63}$ first fixed sub-layer, a $Co_{70}Fe_{30}$ second fixed sub-layer, a Ru third fixed sub-layer, and a $Co_{40}Fe_{40}B_{20}$ fourth fixed sub-layer, and the first fixed sub-layer has a thickness of about 15 nm, the second fixed sub-layer has a thickness of about 2.3 nm, the third fixed sub-layer has a thickness of about 0.85 nm, and the fourth fixed sub-layer has a thickness of about 2.4 nm;

a tunneling barrier, wherein the tunneling barrier comprises MgO, and has a thickness of about 2.4 nm;

a free layer, wherein the free layer comprises $Co_{40}Fe_{40}B_{20}$ and has a thickness of about 2.4 nm; and a top interface layer, wherein the top interface layer comprises a plurality of top sub-layers that are disposed in succession away from the free layer, the plurality of top sub-layers comprise a Ta first top sub-layer, a Cu second top sub-layer, a Ru third top sub-layer, and a Ta fourth top sub-layer, and the first top sub-layer has a thickness of about 5 nm, the second top sub-layer has a thickness of about 10 nm, the third top sub-layer has a thickness of about 5 nm, and the fourth top sub-layer has a thickness of about 3 nm, wherein the device operates as a non-resonant magnetic tunnel junction in a large amplitude, out-of-plane magnetization precession regime having weakly current dependent, large diode volt-watt sensitivity when external microwave signals that exceed a predetermined threshold current and have a frequency that is lower than a predetermined level excite the magnetization precession;

an antenna having two legs; and a load having two ends, wherein the device is electronically coupled in parallel to the legs of the antenna and to the ends of the load.

* * * * *